US012562751B2

(12) United States Patent (10) Patent No.: US 12,562,751 B2

North (45) Date of Patent: Feb. 24, 2026

(54) RELATING TO QUANTUM COMPUTING

(71) Applicant: Universal Quantum Ltd, Brighton (GB)

(72) Inventor: Richard North, Brighton (GB)

(73) Assignee: Universal Quantum Ltd, Brighton (GB)

( * ) Notice: Subject to any disclaimer, the term of this patent is extended or adjusted under 35 U.S.C. 154(b) by 86 days.

(21) Appl. No.: 18/599,045

(22) Filed: Mar. 7, 2024

(65) Prior Publication Data

US 2024/0297662 A1 Sep. 5, 2024

Related U.S. Application Data

(63) Continuation of application No. PCT/GB2022/052296, filed on Sep. 9, 2022.

(30) Foreign Application Priority Data

Sep. 9, 2021 (GB) ..................................... 2112875

(51) Int. Cl.
*H03M 1/66* (2006.01)
*G06N 10/40* (2022.01)

(52) U.S. Cl.
CPC ............ *H03M 1/662* (2013.01); *G06N 10/40* (2022.01)

(58) Field of Classification Search
CPC ......... H03M 1/66; H03M 1/662; G06N 10/40
See application file for complete search history.

(56) References Cited

U.S. PATENT DOCUMENTS

| | | | | |
|---|---|---|---|---|
| 6,024,449 | A * | 2/2000 | Smith | A61B 3/107 351/212 |
| 6,259,745 | B1 * | 7/2001 | Chan | H04B 3/32 370/294 |
| 6,535,989 | B1 | 3/2003 | Dvorak et al. | |
| 10,148,275 | B1 | 12/2018 | Pi | |
| 10,635,990 | B1 * | 4/2020 | Park | G11C 27/024 |
| 2012/0094838 | A1 * | 4/2012 | Bunyk | H03M 1/66 505/170 |

(Continued)

FOREIGN PATENT DOCUMENTS

| | | |
|---|---|---|
| WO | WO-2022123268 A2 | 6/2022 |
| WO | WO-2022123269 A1 | 6/2022 |

(Continued)

OTHER PUBLICATIONS

Akhtar, M. et al. A high-fidelity quantum matter-link between ion-trap microchip modules. arXiv preprint arXiv:2203.14062v1 (Mar. 26, 2022). 8 pages.

(Continued)

*Primary Examiner* — Lam T Mai

(74) *Attorney, Agent, or Firm* — Wilson Sonsini Goodrich & Rosati

(57) ABSTRACT

According to the invention there is provided an ion trap comprising a plurality of electrodes forming an ion trap, a plurality of DACs, each DAC being configured to control an electrode, a clock signal generator, configured to transmit a clock signal to each electrode, a multiplexer configured to stop or transmit the clock signal from the clock signal generator to one or more of the DACs and a clock signal controller configured to control, by the multiplexer, the clock signal to DACs.

18 Claims, 2 Drawing Sheets

(56) References Cited

U.S. PATENT DOCUMENTS

| | | | |
|---|---|---|---|
| 2016/0293393 A1 | 10/2016 | Gordon et al. | |
| 2018/0101786 A1* | 4/2018 | Boothby | H03M 1/1009 |
| 2021/0026162 A1 | 1/2021 | Apisdorf et al. | |
| 2021/0248506 A1* | 8/2021 | Hoskinson | H10N 60/12 |
| 2021/0342730 A1* | 11/2021 | Redmond | G06N 10/60 |
| 2022/0207404 A1* | 6/2022 | Boothby | H10N 60/805 |
| 2023/0359916 A1* | 11/2023 | Weber | G06N 10/40 |
| 2024/0113923 A1* | 4/2024 | Ang | H03M 1/66 |
| 2024/0296363 A1 | 9/2024 | North | |
| 2024/0380580 A1* | 11/2024 | Wang | G06N 10/60 |
| 2024/0419207 A1* | 12/2024 | Hunter | G06N 10/40 |

FOREIGN PATENT DOCUMENTS

| | | |
|---|---|---|
| WO | WO-2023275556 A1 | 1/2023 |
| WO | WO-2023007189 A1 | 2/2023 |
| WO | WO-2023007190 A1 | 2/2023 |
| WO | WO-2023037124 A1 | 3/2023 |
| WO | WO-2023037126 A1 | 3/2023 |

OTHER PUBLICATIONS

Akhtar, M. et al. A high-fidelity quantum matter-link between ion-trap microchip modules. arXiv preprint arXiv:2203.14062v2 (Apr. 5, 2022). 8 pages.

Akhtar, M. et al. A high-fidelity quantum matter-link between ion-trap microchip modules. arXiv preprint arXiv:2203.14062v3 (Nov. 20, 2022). 10 pages.

Akhtar, M. et al. A high-fidelity quantum matter-link between ion-trap microchip modules. Nature Communications 14(1):531, 1-8 (2023).

GB2112871.5 Office Action with Search Report dated Jun. 24, 2022.

GB2112875.6 Office Action with Search Report dated Jun. 14, 2022.

Lekitsch, Bjoern, et al. Blueprint for a microwave trapped ion quantum computer. Science Advances 3.2 (2017): e1601540. 11 pages.

Mount, Emily et al. Scalable Digital Hardware for a Trapped Ion Quantum Computer. Quantum Information Processing 15:5281-5298 (2015).

PCT/GB2022/052296 International Preliminary Report on Patentability dated Mar. 21, 2024.

PCT/GB2022/052298 International Preliminary Report on Patentability dated Mar. 21, 2024.

PCT/GB2022/052298 International Search Report and Written Opinion dated Mar. 16, 2023.

Kaushal, V., et al. Shuttling-based trapped-ion quantum information processing. AVS Quantum Science, vol. 2, 1-25 (2020).

PCT/GB2022/052296 International Search Report and Written Opinion dated Mar. 16, 2023.

* cited by examiner

RELATING TO QUANTUM COMPUTING

CROSS-REFERENCE

This application is a continuation of international application PCT/GB2022/052296, filed Sep. 9, 2022, which claims the benefit of GB Application No. 2112875.6 filed on Sep. 9, 2021, which applications are each incorporated herein by reference in its entireties.

FIELD

The present invention relates to providing a reduced noise ion trap quantum computer.

BACKGROUND

Quantum computing in general, unlike so-called "classical computing", relies on the quantum mechanical properties of particles or matter to produce or alter data. The data may be represented by quantum bits or "qubits", which are a two-state quantum mechanical system. Unlike classical computing, the qubit may be in a superposition of quantum states. Another feature of quantum computing is the entanglement between qubits in which the state of one particle or atom is influenced by another particle or atom.

Quantum mechanical qubits are able to encode information as combinations of zeros and ones simultaneously. Such properties open numerous complex numerical applications that are traditionally difficult for classical computers. Examples include artificial intelligence, image processing and recognition, cryptography, or secure communications and so on.

Within an ion hyperfine, electronic states (Zeeman split states) can be revealed by the use of a magnetic field and the different electron levels used as the different qubit states and electrons moved between the levels using microwave radiation or lasers.

SUMMARY

In ion trap quantum computers (quantum charged coupled devices), ion traps can be used to control ions used in quantum computation and surface electrodes are used to generate electric fields to manipulate and trap the ions suspended in free space. The surface electrode potentials of an ion-trap are in turn controlled by DACs. State-of-the-art quantum computers use many DACs of the same type, for example 16-bit DACs with a better than 1 MHz update rate.

Each individual electrode is independently controllable, and each electrode has a corresponding DAC coupled thereto. The timing at which the electrodes move must be carefully controlled, and a clock signal is transmitted to each DAC to ensure that the timing of DAC signals is carefully controlled.

Noise within an ion trap system reduces the fidelity of the qubits which limits the usefulness of the system.

It is an aim of the invention to provide an ion trap system with reduced noise. In particular, it is desirable to reduce the noise in the range 100 kHz-1 MHz, to which a trapped ion qubit may be particularly sensitive.

According to the invention there is provided an ion trap comprising a plurality of electrodes forming an ion trap, a plurality of DACs, each DAC being configured to control an electrode, a clock signal generator, configured to transmit a clock signal to each electrode, a multiplexer configured to stop or transmit the clock signal from the clock signal generator to one or more of the DACs and a clock signal controller configured to control, by the multiplexer, the clock signal to the DACs. This minimizes the clock signals transmitted to DACs, and, therefore, the noise within the system. However, clock signals are transmitted where they are needed so the efficiency of the system is not compromised.

The methods described herein are used to minimize noise. Although they are described in relation to ion traps, the method of controlling the clock signals to electrodes can be applied to other quantum computers, for example, superconducting qubits or any other qubits which require precise control.

The electrodes and DACs may be grouped into a plurality of groups and the multiplexer is configured to stop or transmit the clock signal to all DACs within a group. The DACs and electrodes within a group are preferably arranged proximate to each other within the ion trap. A single multiplexer can then control transmission of the clock signal to all the DACs within an area. This is advantageous because if the qubit is not in an area, or not moving, all the DACs within that area would not need to be updated. Each DAC and electrode pair is preferably part of a single group.

The DACs may be configured to generate a DC signal or a radio frequency signal. As such the timing of DC and/or radio frequency signals can be synchronized.

The DACs coupled to the multiplexer may be configured to generate a radio frequency signal. Alternatively, they may be configured to generate a DC signal.

The multiplexer is preferably a glitch free multiplexer so that the multiplexer is only switched on or off (i.e., the state changed) when the clock signal is not on.

The ion trap may be a surface ion trap. The ion trap may be arranged in a quantum computer.

According to the invention there is provided a method of manipulating ions in an ion trap comprising a plurality of electrodes, each controlled by a DAC, the method comprising generating a clock signal, generating one or more signal clock signal control signals for one or more corresponding DACs and controlling transmission of the clock signal to each DAC in accordance with the clock signal control signal corresponding to the corresponding one or more DACs.

In an embodiment the clock signal transmitted to the respective DAC only when the DAC value is to be changed.

DETAILED DESCRIPTION

Figure 1:
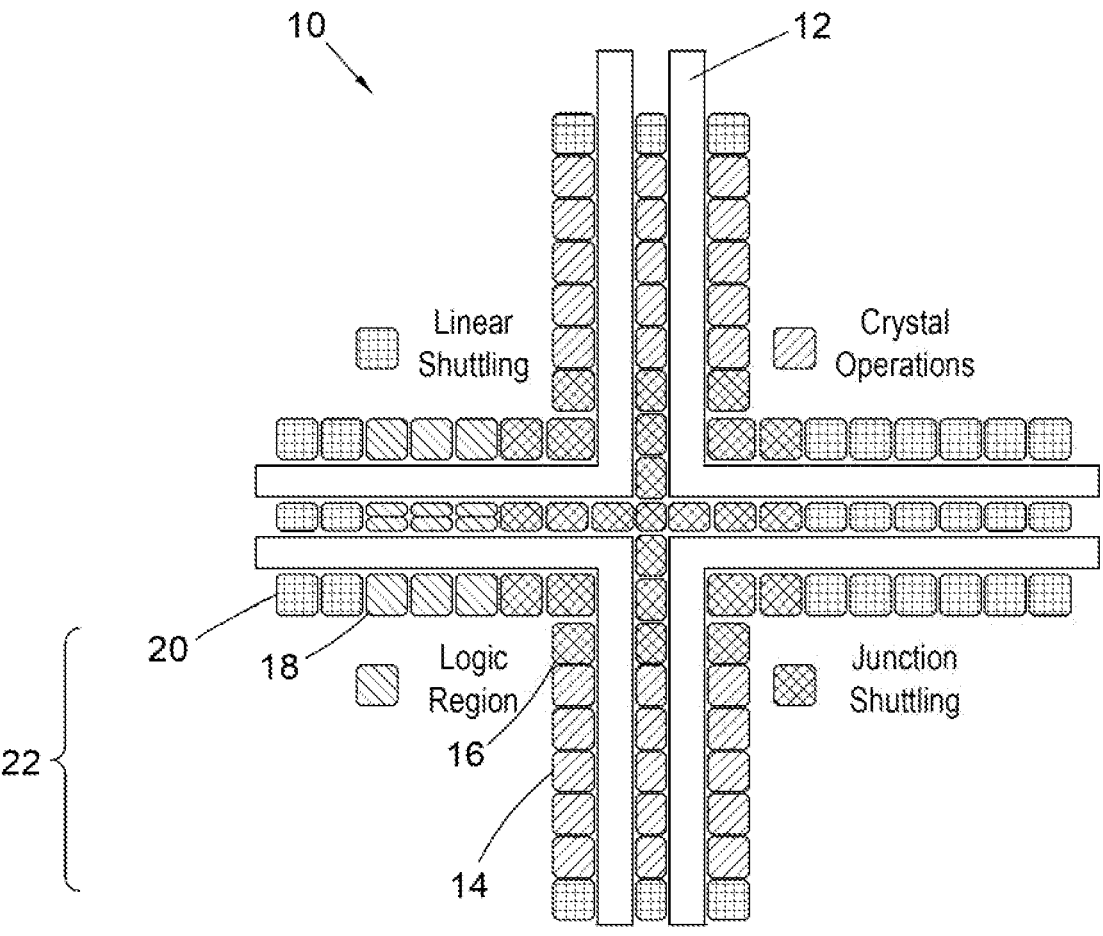
FIG. 1 depicts an array of electrodes used in conjunction with the invention.

Referring to FIG. 1, there is an example arrangement of electrodes used in conjunction with this invention. FIG. 1 shows an x-junction device 12 in a trapped ion quantum computer 10. The x-junction 12 comprises a plurality of electrodes 22 configured to trap an ion in an area of the x-junction device 12. Each electrode 22 is driven by a DAC to carry out the function of the area of the x-junction device 12. The x-junction device 12 is divided into areas. The areas of the x-junction device 12 can be divided into crystal operations 14, junction shuttling 16, logic region/gate zone 18 and linear shuttling 20 depending on the function being carried out in each area.

The x-junction is divided into four sections, a north section (above the center as depicted on FIG. 1), an east section (right of the center as depicted on FIG. 1), a south section (below the center as depicted on FIG. 1) and a west section (left of the center as depicted on FIG. 1). If there is no ion within the section, there may be no signal applied to any of the electrodes. Alternatively, there may be a signal, but no change in signal. Similarly, if an ion is being shuttled in from the left to the center, no signals may be applied to the electrodes in the north, east, or south sections.

An ion trap is formed by a plurality of DC electrodes, which control the position of the ion in a longitudinal direction, and a plurality of RF electrodes, which control the position of an ion in an axial direction. As such, timing of any changes in the signals to electrodes, which in turn are controlled by DACs is very important. The timing of signals is synchronized by a clock signal. However, a clock signal can be noisy which is undesirable, especially during gate functions.

The radio frequency signal may be in the range 10-40 MHz, which generates an Axial trap frequency. For example, this might be 3 MHz.

The DC electrodes have a maximum voltage, Vdac.

The gradient of the well created by the DC electrodes (Dv/Dx) generates a motional trap frequency. For example, 500 KHz.

Figure 2:
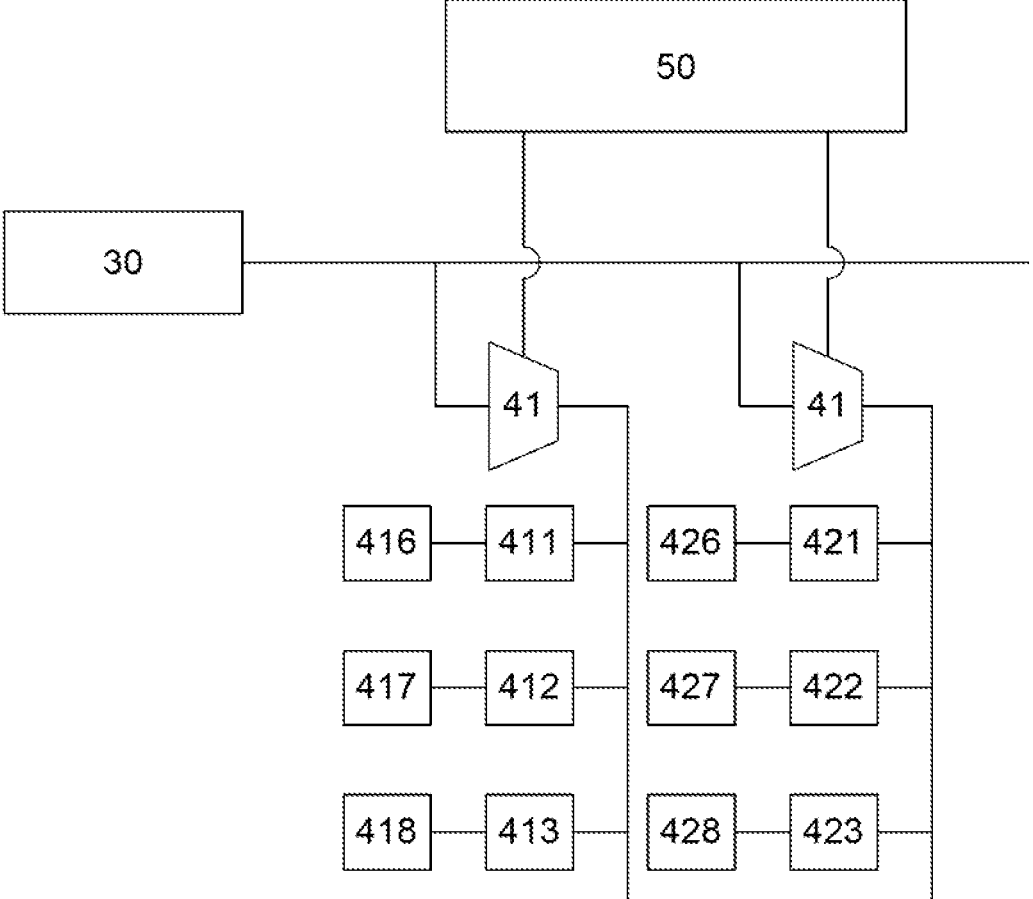
FIG. 2 depicts an arrangement according to the invention.

FIG. 2 depicts an arrangement according to the invention. As can be seen there is a clock 30 which generates a clock signal. The clock signal is transmitted to a series of multiplexers 41 and 42. In this example, the same clock signal is transmitted to all the multiplexers. The clock signal may take the form of a pulsed signal but could be any clock signal.

Each multiplexer is coupled to a plurality of DACs in a particular area. For example, a multiplexer may be coupled to the north section DACs as described above or the south section DACs as described above.

FIG. 2 also depicts a clock control unit 50. The clock control unit 50 transmits clock control signals to the multiplexers 41 and 42. The clock control signals transmitted to each multiplexer are generally independent of each other. The clock control signal controls whether the clock signal generated by the clock 30 is transmitted, by the multiplexers, to the plurality of DACs 411, 412, 413, 421, 422, and 423. The clock signals are used in the timing of the DAC signals, and each DAC is coupled to an electrode 415, 416, 418, 426, 427, and 428. The electrodes may be DC electrodes or radio frequency (RF) electrodes.

The ion trap may comprise DACs configured to generate DC signals, which are coupled to DC electrodes, and DACs configured to generated RF signals, which are coupled to RF electrodes. The DC electrodes control the position of the ion in a longitudinal direction and the RF electrodes control the position of the ion in axial directions. The typical radio frequency used is in the range 10-40 MHz.

The signal from a DAC is transmitted to an electrode, which may be either a DC electrode or a RF electrode. Thus, a clock signal is transmitted to a DAC to generate a signal which controls an electrode, which in turn controls the position of an ion. In order for the position and motion of an ion to be controlled the signals to the electrodes must be synchronized by a clock signal. However, if there is no ion in the region or if the ion is not moving (and there is, for example, a gate function), then the clock signal may not be needed. This is particularly important during gate operations when noise must be minimized.

If the qubit is not within a section or not moving within a section and, therefore, the DAC values within a section are not changing, it is not necessary to transmit the clock signal to the DACs. The clock control signal therefore stops the clock signal from being transmitted to the DACs with which it is coupled.

For example, at a particular time the clock control signal to multiplexer 41 may control the multiplexer 41 to transmit the clock signal to the DACs 411, 412, and 413 to which it is coupled. The DAC outputs can therefore be changed based on the clock timing transmitted. At the same time, the clock control signal to the multiplexer 42 may stop the clock signal from being transmitted to the DACs 421, 422, and 423 to which it is connected. The signals from each of the DACs therefore remains unchanged. For example, DC DACs 421, 422, 423 may be at different values but, due to the absence of the clock signal, those values will not change. For RF DACs, with no clock signal, the RF signal will remain at the same frequency and strength.

The clock signal generates noise within the system and reducing the number of DACs which receive the clock signal therefore reduces the noise within the system. In particular, with the invention transmission of the clock signal to a particular area can be stopped while a gate function is occurring in that area.

The multiplexer is preferably a glitch free multiplexer such that it does not switch on or off during a clock pulse. The multiplexer may be a clock buffer with output control.

Although the description above describes a multiplexer coupled to a plurality of DACs, there could alternatively be a multiplexer coupled to each DAC. A multiplexer may be coupled to DACs in a particular physical region, which other multiplexers coupled to a different multiplexer. Another alternative is that a multiplexer may be coupled to different types of DACs (e.g., DC DACs or RF DACs) in a particular region. For example, a first multiplexer may be coupled to DC DACs in a region and a second multiplexer may be coupled to RF DACs in a particular region.

The DACs may be grouped, with a single multiplexer controlling the clock signal to all the DACs in a group. A DAC may be part of a single group, or alternatively may be part of two or more groups, such that a clock signal is transmitted via one or other multiplexers.

As can be seen in FIG. 2, there are a plurality of multiplexers, each controlling a group of DACs.

Although not depicted, multiplexers could be arranged in a tree structure such that one multiplexer controls or transmits the clock signal to a plurality of multiplexers, which in turn controls or blocks any clock signal to a plurality of DACs. One example of this would be a multiplexer controlling a plurality of multiplexers for all the DACs in a larger region, but each sub-multiplexer controlling the DACs to a smaller part of the region.

The DAC may alternatively be a DAC controller for example to provide DAC values. The multiplexer may switch of the DAC as a whole or partially.

Ions are sensitive to noise at less than 10 MHz, particularly in the range 100 kHz-1 MHz. As the clock frequency may be in this range, it is particularly important to minimize this, especially while gate functions are being performed. As a further alternative, the clock control signal can be used only to transmit the clock signal when a new waveform is to be applied to the DAC. This enables accurate control of the DAC timing.

"And/or" where used herein is to be taken as specific disclosure of each of the two specified features or components with or without the other. For example, "A and/or B" is to be taken as specific disclosure of each of (i) A, (ii) B and (iii) A and B, just as if each is set out individually herein.

Unless context dictates otherwise, the descriptions and definitions of the features set out above are not limited to any particular aspect or embodiment of the invention and apply equally to all aspects and embodiments which are described.

It will further be appreciated by those skilled in the art that although the invention has been described by way of example with reference to several embodiments. It is not limited to the disclosed embodiments and that alternative embodiments could be constructed without departing from the scope of the invention as defined in the appended claims.

What is claimed is:

1. A quantum computer comprising:

a quantum processor comprising:

(a) a clock, wherein the clock is configured to generate a clock signal;

(b) a multiplexer, wherein the multiplexer is configured to receive the clock signal from the clock; and (c) a clock control unit, wherein the clock control unit is configured to control, by the multiplexer, a transmission of the clock signal to a digital-to-analog converter (DAC), and wherein the clock signal is configured to control a gate operation.

2. The quantum computer of claim 1, wherein the clock control unit is configured to transmit a clock control signal to the multiplexer, wherein the clock control signal is configured to control the transmission of the clock signal to the DAC.

3. The quantum computer of claim 1, further comprising a plurality of DACs comprising at least the DAC.

4. The quantum computer of claim 3, wherein the multiplexer is configured to transmit the clock signal to each DAC in the plurality of DACs.

5. The quantum computer of claim 3, wherein the multiplexer is configured to transmit the clock signal to a group of DACs in the plurality of DACs.

6. The quantum computer of claim 3, further comprising a plurality of multiplexers comprising at least the multiplexer.

7. The quantum computer of claim 6, wherein the multiplexer in the plurality of multiplexers is configured to transmit the clock signal to the DAC in the plurality of DACs.

8. The quantum computer of claim 6, wherein each multiplexer in the plurality of multiplexers is configured to transmit the clock signal to a group of DACs in the plurality of DACs.

9. The quantum computer of claim 8, wherein the group of DACs comprises a set of DACs within a region.

10. The quantum computer of claim 8, wherein the group of DACs comprises either direct current (DC) DACs or radio frequency (RF) DACs.

11. The quantum computer of claim 8, wherein the DAC in the plurality of DACs is in multiple groups of DACs, wherein each of the multiple groups of DACs comprises a set of DACs with a region.

12. The quantum computer of claim 6, wherein the plurality of multiplexers is arranged in a tree structure.

13. The quantum computer of claim 1, wherein the DAC is configured to generate a direct current (DC) signal or a radio frequency (RF) signal to an electrode.

14. The quantum computer of claim 1, wherein the DAC corresponds to an electrode, and wherein the electrode is configured to manipulate an ion.

15. The quantum computer of claim 14, wherein the clock control signal is configured to stop transmission of the clock signal to the DAC when the ion is not in a region associated with the electrode.

16. The quantum computer of claim 14, wherein the clock control signal is configured to stop transmission of the clock signal to the DAC when the ion is not moving.

17. The quantum computer of claim 1, wherein the quantum computer is an ion trap quantum computer.

18. A method of manipulating ions in a quantum computer, the method comprising:

(a) generating a clock signal and a clock control signal;

(b) transmitting the clock signal and the clock control signal to a multiplexer; and (c) transmitting, by the multiplexer, the clock signal to a digital-to-analog converter (DAC), wherein the clock control signal is configured to control the transmission of the clock signal to the DAC, and wherein the clock signal is configured to control a gate operation.

* * * * *